United States Patent [19]

Pascoe

[11] 4,417,202
[45] Nov. 22, 1983

[54] VITAL DC SOURCE GROUND FAULT DETECTOR APPARATUS

[75] Inventor: Robert D. Pascoe, Upper St. Clair Township, Allegheny County, Pa.

[73] Assignee: American Standard Inc., Swissvale, Pa.

[21] Appl. No.: 230,146

[22] Filed: Jan. 30, 1981

[51] Int. Cl.³ .......................................... G01R 31/02
[52] U.S. Cl. .................................... 324/51; 340/650
[58] Field of Search ............ 246/28 C, 34 C; 324/51; 340/650, 651; 361/60, 45

[56] References Cited

U.S. PATENT DOCUMENTS

| | | | |
|---|---|---|---|
| 2,022,758 | 12/1935 | Corderman | 177/311 |
| 2,622,139 | 12/1952 | Dodd | 177/311 |
| 2,623,107 | 12/1952 | Baughman | 177/311 |
| 3,801,898 | 4/1974 | Young | 340/650 X |
| 3,962,606 | 6/1976 | Burns et al. | 317/18 D |
| 3,976,987 | 8/1976 | Anger | 324/51 X |
| 4,002,968 | 1/1977 | Reid | 324/51 |
| 4,083,041 | 4/1978 | Bennice | 340/650 |

FOREIGN PATENT DOCUMENTS

| | | | |
|---|---|---|---|
| 1516102 | 12/1969 | Fed. Rep. of Germany | 324/51 |
| 2809596 | 9/1979 | Fed. Rep. of Germany | 324/51 |
| 552519 | 4/1943 | United Kingdom | 324/51 |
| 744339 | 6/1980 | U.S.S.R. | 324/51 |

*Primary Examiner*—Stanley T. Krawczewicz
*Assistant Examiner*—Jose M. Solis
*Attorney, Agent, or Firm*—A. G. Williamson, Jr.

[57] ABSTRACT

A pair of transistors, alternately activated by a low frequency generator, alternately connect the positive and negative terminals of the monitored DC source to the common bus of the ground detector apparatus. Each produces a fault current signal flow through any ground fault existing on the other source terminal, with the return circuit including a permanent ground rod, the input of a comparator, and apparatus common. An opposing reference current signal of preselected level is applied to the comparator input, at the same time as each fault signal, from a current pump network driven by the low frequency generator. If each reference current signal is larger than the corresponding fault current signal, the comparator output is a square wave signal of alternate plus and minus pulses which is applied to a negative voltage generator network controlled by contacts of two synchronizing relays alternately driven by the low frequency generator. If the comparator square wave output is synchronized with synchronizing relay operation, a registry relay is held energized to indicate the absence of ground faults on the source. If either or both fault current signals are greater than the corresponding reference current signal, the output is either of one polarity or is not synchronized with the relays so that the registry relay is deenergized and releases to indicate a ground fault condition.

6 Claims, 5 Drawing Figures

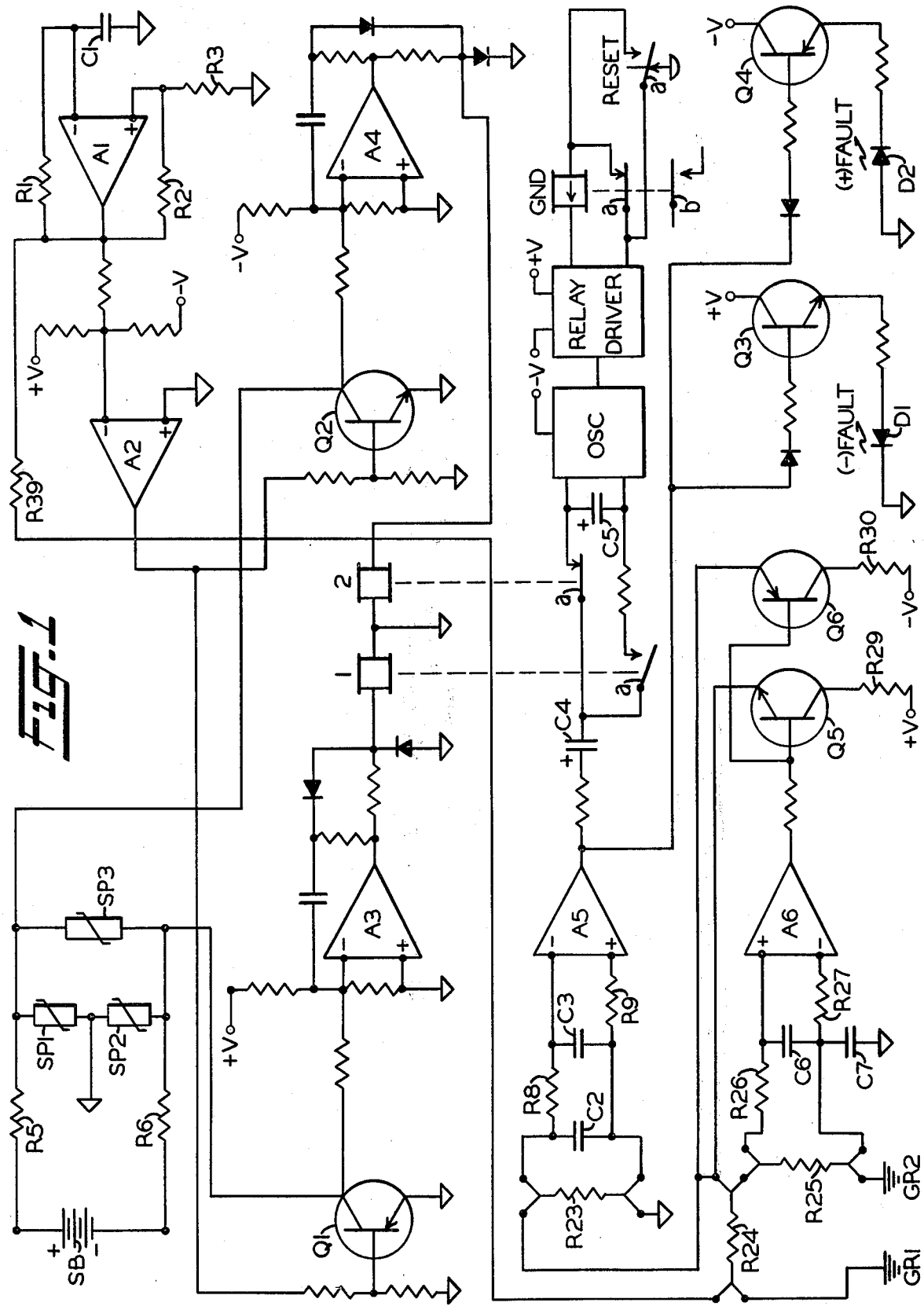

VITAL DC SOURCE GROUND FAULT DETECTOR APPARATUS

BACKGROUND OF THE INVENTION

My invention pertains to ground fault detector apparatus. More particularly, the invention pertains to a vital, solid-state ground detector arrangement for detecting grounds on each terminal of a direct current source, particularly for railroad signaling systems.

In signaling systems using direct current, ground fault conditions may occur in the circuits at times, particularly where such circuits are carried in underground cables. Should the ground faults occur in the control circuits for relays, these devices may pick up or release, depending upon their connections, and function to initiate circuit operations for which they are provided. Particularly when such relays control the operation of safety devices such as railway signals or track switches in a railway signaling system, it is desirable that the ground fault condition be detected and removed as soon after occurrence as possible. In addition, it may be further desirable to inhibit the further functioning of the signaling system, or at least those particular elements where the fault condition exists, until the trouble is corrected. Detector apparatus for ground faults is known in the signaling art. However, with the advent of the use of solid-state elements in such signaling systems, a need has developed for a solid-state circuit arrangement for detecting such fault conditions whose operation is reliable and vital so that improper operation of the signaling system may be inhibited until the fault is corrected.

Accordingly, an object of my invention is an improved ground detector apparatus using solid-state elements.

Another object of the invention is an improved ground detector for a local direct current source which independently detects positive and negative fault currents even if simultaneous ground faults occur.

A further object of the invention is vital ground detector apparatus for a railroad signaling system which alternately checks the presence of ground faults on the positive and negative leads from the direct current energy source, registering any detected fault condition by the release of a normally energized vital relay.

Still another object of my invention is detector apparatus which alternately compares the level of ground fault currents from opposite terminals of a direct current energy source against alternately selected reference current levels to determine if a ground fault condition exists on either energy source terminal.

Another object of the invention is solid-state ground detector apparatus for a railroad signaling system which holds a vital registry relay energized as long as alternate comparisons of the level of the ground leakage current from opposite terminals of the direct current source against preselected reference current levels determine that each leakage current is less than the associated reference current, detection of the opposite current condition from either source terminal or both actuating the release of the relay to register a ground fault condition.

A further object of my invention is a solid-state ground detector for a direct current source in which a switching means and a current pump element are driven to alternately produce associated signal pairs, each comprising a ground fault current and a selected level reference current, successive pairs relating to the opposite terminals of the direct current source; the successive pairs of current signals are applied with opposing relationship to a comparator which produces successive output pulses each indicating in accordance with the relative levels of the corresponding signal pair whether or not a fault condition exists; and which output is supplied through a synchronizing network to hold a vital relay in a no-fault indication condition as long as the comparator output when synchronized with the input signal pairs indicates the absence of any ground fault on either terminal of the source.

Other objects, features, and advantages of the invention will become apparent from the following specification and appended claims when taken in connection with the accompanying drawings.

SUMMARY OF THE INVENTION

According to my invention, the detector apparatus develops successive fault current signals alternately representing the leakage current to an earth ground fault from the positive and negative terminals of a local direct current energy source, for example, that of a railway signaling system and which is specifically shown as being a battery. To accomplish this, transistor switches driven by a low frequency oscillator network alternately connect the opposite source terminals to the common bus of the detector apparatus. As the transistor switches are alternately actuated, each also drives, through a separate operating amplifier (OP AMP), one of a pair of synchronizing relays which control a synchronizing detector network providing a final check on the operation of the detector apparatus. In the monitoring network, during each switching period, the level of the leakage current to a ground fault from the opposite source terminal is checked during each of the monitoring periods. In other words, a ground leakage current signal from the positive source terminal is produced when the negative terminal is connected to the apparatus common bus and vice-versa. A check for the existence of ground faults is then accomplished by comparing the level of each produced leakage current signal against a reference current signal of predetermined level. This latter signal is separately produced for the positive and negative terminals of the source by alternately actuated current pump circuits, for example, a pair of transistors controlled by the low frequency oscillator through a separate OP AMP.

The comparison of the current signals is accomplished through a comparator network which includes an OP AMP. Both the reference current signal and the leakage current signal relating to a particular terminal of the local source are applied in opposing directions through a resistor serving as the input of the comparator OP AMP. The corresponding pairs of such current signals are alternately applied as the switching transistors are alternately actuated. A particular leakage current may be said to flow from the monitored source terminal through the leakage impedance fault of any existing earth ground, thence through an apparatus ground rod and the comparator input resistor, returning to the opposite source terminal through the common bus connection established by the associated transistor switch. Since the connection through the ground rod is critical to the vital operation of the apparatus, the continuity in this connection is checked by a second ground rod connected so that the OP AMP driving the current pumps functions only if both ground rod connections are intact.

The output of the comparator amplifier is applied to the synchronous detector network which is controlled by contacts of the synchronizing relays and acts as a negative voltage generator. If each leakage current signal is less than the corresponding reference current signal, the output of the amplifier is a square wave with alternate positive and negative pulses in a predetermined phase relationship with the relay contact operation and of sufficient amplitude to hold energized, over a stick circuit, a vital registry relay. Specifically, for a practicable arrangement, the output of the synchronizing network is applied to hold active a second oscillator, having a somewhat higher frequency, which in turn actuates a driver circuit network to hold the relay energized. If either leakage current is greater than the corresponding reference current, the character of the output pulse from the comparator during that portion of the switching cycle is reversed so that a square wave output is no longer produced. This results in an improper output from the synchronizing network so that the relay, through the oscillator, driver network, is deenergized and releases to register a fault indication. If faults exist on both terminals of the local source so that both output signals are reversed, the resulting square wave is out of phase with the operation of the synchronizing circuit so that insufficient energy is provided to the oscillator, relay driver network and the relay again releases. As specifically shown, the relay is held energized over a stick circuit so that, once released, a manual reset is required in order to restore the no-fault registration when the actual fault condition is corrected. If desired, the relay release may also be used to interrupt or inhibit the operation of whatever signaling device is involved.

BRIEF DESCRIPTION OF THE DRAWINGS

Before defining the invention in the appended claims, I will describe a specific and preferred embodiment of the detector apparatus of the invention as illustrated in the accompanying drawings in which:

FIG. 1 is a schematic circuit diagram illustrating a preferred arrangement of the detector apparatus embodying the invention.

FIGS. 2A, B, C, are equivalent circuit diagrams useful in explaining the operation of the apparatus illustrated in FIG. 1.

FIG. 3 is a legend illustrating symbols used in the other figures of the drawings.

In each of the figures of the drawings, the same or similar parts of the apparatus are designated by similar reference characters. For the complete detector arrangement illustrated in FIG. 1, energy for the operation of the apparatus is supplied by a separate direct current source with a center tap connected to the apparatus common or system ground bus. This source is illustrated in FIG. 3 as the battery DB with its positive and negative voltage terminals designated $+V$ and $-V$, respectively. As a specific example, these voltages may be $+12$ and $-12$. This operating energy source is separate and distinct from the local source being monitored for ground faults. This local source as shown in the upper left of FIG. 1 as a battery SB which supplies operating energy, for example, to railroad signaling and/or communication systems. The apparatus of my invention is used to detect and register ground faults on the positive and negative terminals of this source SB. It may be noted that, if necessary, the apparatus energy source DB may be filtered to eliminate harmonics and to isolate the local or signaling system source.

Also in the drawings, connections to the apparatus common or ground bus are shown by a triangle symbol illustrated in the center of FIG. 3. This is used to distinguish from earth ground connections through actual ground rods driven into the earth which are illustrated by the conventional ground symbol shown at the bottom of FIG. 3. Two such ground rod connections, designated GR1 and GR2, are shown in the lower left of FIG. 1. Ground faults on the local signaling battery SB are illustrated in FIGS. 2A and 2B by the same conventional ground symbol. The apparatus illustrated in FIG. 1 is protected from any over-voltage or surges on the local source by the surge protectors SP1, SP2, and SP3 shown in the upper left of FIG. 1. These devices are connected in a conventional surge protection network and may be of a varistor type as specifically illustrated although not limited to this device.

DESCRIPTION OF THE ILLUSTRATED EMBODIMENT

Referring to FIG. 1, the OP AMP A1 and its associated components, resistors R1, R2, and R3 and capacitor C1, function as a square wave generator of low frequency. In one specific installation of the apparatus, this frequency is on the order of 0.2 Hz. It is to be noted that each amplifier illustrated by conventional symbol in this specific embodiment circuit arrangement is supplied with direct current operating energy from the source DB whose terminals are designated as $+V$ and $-V$. Since this is conventional in such apparatus, for simplicity such connections are not shown but are to be understood. Amplifier A2 functions as a supply voltage comparator of the voltage levels at terminals $+V$ and $-V$. This amplifier enables the oscillator element including amplifier A1 to drive switching transistors Q1 and Q2 if the absolute values of the voltages at terminals $+V$ and $-V$ are within a small percentage of each other. Since transistors Q1 and Q2 are opposite types, they conduct on alternate half cycles of the square wave output of amplifiers A1 and A2. Thus these transistors alternately connect the positive and negative terminals of signal battery SB, shown in the upper left, to the apparatus common bus through resistors R5 and R6. The operation of transistors Q1 and Q2 also drives the OP AMPS A3 and A4, respectively, which in turn alternately drive, that is, energize, the synchronizing relays 1 and 2. These relays are shown by conventional symbols but for example may be biased reed relays. Contacts of the relays shown vertically below each winding symbol are used in synchronizing the detector in the manner to be discussed later. The connections in each relay control network are such that the relay is released when the associated transistor is conducting (ON) and vice-versa. Obviously relays 1 and 2 cycle at the frequency of the square wave from amplifier A1 so that when one is energized and its contact picked up (closed), the other is deenergized and its contact released (open).

The OP AMP A6 alternately turns on transistors Q5 and Q6 which act as current pumps to provide reference currents against which the ground leakage current from the terminals of battery SB may be compared. When transistor Q5 conducts, a reference current is applied, from $+V$ through resistor R23 to common, against which the leakage current from the negative terminal of battery SB may be compared. Conversely, when transistor Q6 conducts, an opposite polarity reference current is supplied to the same resistor against which the leakage current from the positive battery terminal is compared. The levels of these reference currents are preselected by the values of the resistors R29 and R30, respectively. The input for amplifier A6 is provided by the voltage across resistor R25, one terminal of which is connected to ground rod GR2. It is to be noted that resistor R25 as well as resistors R23 and R24 are of the four terminal, vital type resistors as indicated by a conventional symbol used for such resistors. In connection with amplifier A6, resistors R26 and R27 together with capacitors C6 and C7 form a filter to eliminate induced frequencies or harmonics from extraneous sources.

The OP AMP A5 functions as a square wave voltage source for the synchronous detector network, or negative voltage generator, which supplies energy to the vital, biased, direct current relay GND which registers the absence or the presence of a ground fault on either terminal of battery SB. The input to amplifier A5 is the voltage across resistor R23 which is connected between the junction of resistors R24 and R25 and the apparatus common bus. A filter network comprising resistors R8 and R9 and capacitors C2 and C3 is used to block improper frequencies, due to extraneous voltages and/or harmonics from the oscillators, from effecting the operation of amplifier A5. In order to supply sufficient energy for the operation of relay GND, the output of the negative voltage generator network, which comprises capacitors C4 and C5 and contacts a of relays 1 and 2, is used to actuate an oscillator which supplies its output to a relay driver element which in turn energizes relay GND. This oscillator has a higher frequency than that of the square wave voltage generated by amplifier A1, for example, in one specific application a frequency of 200 Hz. It will also be noted that relay GND is normally energized over a stick circuit including its own front contact a. Contact a of a reset pushbutton is used for a manual reset operation to be discussed later.

To assist in understanding the operation of the detector apparatus, I will describe equivalent circuits shown in the various parts of FIG. 2 which illustrate the basic method of measuring the leakage current from a terminal of battery SB to a ground fault. FIG. 2A shows the equivalent circuit during one of the two alternate switching conditions when the negative terminal of battery SB is connected to the common bus of the detector apparatus by an active transistor switch, e.g., transistor Q1 of FIG. 1. Resistor RL(+) represents the impedance of any existing fault connection to ground from the positive terminal of battery SB. During this monitoring period, a leakage current $I_L$ flows through resistor RL(+), as indicated by the conventional arrow, to the ground fault and thence through ground rod GR1 and resistor R23 to the common bus of the apparatus, returning through the active transistor switch to the negative terminal of battery SB. This leakage current $I_L$ is compared against a preselected reference current $I_R(+)$ which flows from the apparatus common bus through resistor R23, returning through the circled arrow symbol representing a current pump and/or source to the apparatus common. The current pump is the equivalent of previously described transistor Q6 of FIG. 1. The resulting comparison signal resulting from the flow of the reference and leakage currents in opposite directions through resistor R23 is supplied to amplifier A5. The output signal $V_O$ of this amplifier, if the leakage current is less than the preselected reference current, has a positive characteristic. Conversely, if the leakage current is greater than the reference current, the output $V_O$ of amplifier A5 has a negative level characteristic. Obviously when no fault or a very high leakage resistance fault exists on the positive terminal of battery SB, the output $V_O$ of amplifier A5 is positive.

An equivalent circuit during the other switching condition is shown in FIG. 2B. During this monitoring period, the positive terminal of battery SB is connected to the apparatus common bus by an active transistor switch such as transistor Q2 in FIG. 1. Resistor RL(−) represents the impedance of any ground fault existing on the negative terminal of battery SB. Depending upon the magnitude of this fault impedance, a leakage current $I_L$ flows through resistor RL(−) in the direction indicated by a conventional arrow. This current originates at the positive terminal of battery SB which is connected through the switch to the common bus and returns through resistor R23, ground rod GR1, and the ground fault and resistor RL(−) to the negative terminal of battery SB. This leakage current is compared against the preselected reference current $I_R(-)$, developed in the current pump equivalent to transistor Q5 in FIG. 1, which flows from this pump in a downward direction through resistor R23 to the common bus of the apparatus. The resulting comparison signal in resistor R23 is supplied to amplifier A5. During this period, the output signal $V_O$ has a negative or positive characteristic, respectively, as the leakage current is less than or is greater than the reference current. Thus when no ground fault or a very high impedance ground fault exists on the negative terminal of battery SB, the output of amplifier A5 has a negative voltage characteristic.

The output of amplifier A5 is supplied to a synchronous detector, a simple equivalent circuit network for which is illustrated in FIG. 2C. This synchronous detector develops the negative voltage to drive the ground detector or registry relay GND which is a vital, biased, DC relay held energized over a stick circuit while the detector apparatus is operating normally to indicate the absence of ground faults on the signal battery. This synchronous detector or negative voltage generator includes capacitors C4 and C5 and a contact of each synchronizing relay 1 and 2 closed when the relay is energized. In other words, illustrated contacts 1 and 2 alternately close as driven by the square wave generator (A1) in synchronism with the transistor switches. In the condition shown, i.e., contact 2 closed and contact 1 open, the positive terminal of battery SB is being monitored for ground faults. As long as both leakage currents are less than their respective reference currents, as compared in the manner illustrated in the equivalent circuits of FIG. 2A and FIG. 2B, the output of amplifier A5 is a square wave synchronized with the operation of relays 1 and 2 and relay GND is retained energized.

If the leakage current from the positive terminal of battery SB is greater than the reference current $I_R(+)$, the output of amplifier A5 remains negative during both half cycles of its output wave and relay GND is deenergized and releases to register a ground fault. If the leakage current from the negative terminal of battery SB becomes greater than the reference current $I_R(-)$, the A5 output remains positive during both half cycles of the wave and again relay GND becomes deenergized and releases. If both the positive and negative leakage currents become greater than their respective reference currents, the output of amplifier A5 is a square wave alternating between plus (+) and minus (−) characteristics but is out of phase with the operation of contacts 1 and 2 so that energy of improper polarity is supplied to relay GND which releases to register the double ground fault condition. Once relay GND has released to register a ground fault, it cannot be reenergized until a manual reset action, taken after the fault condition is corrected, closes the contact of the reset pushbutton. Obviously the operation of the detector apparatus must be proper, that is, no internal fault exists, in order for relay GND to remain energized and thus indicate the no-fault condition on the signal battery. This results in a vital operation of the detector apparatus.

Referring again to FIG. 1 for the operation of the apparatus, the basic circuits of the parts of FIG. 2 are expanded to complete a practicable, reliable, and desirable circuit arrangement for the ground fault detector apparatus of the invention. A major modification, beyond the filling out of the various circuit networks, is the use of an oscillator and relay driver network between the synchronous detector, negative voltage generator network and the registry relay GND to provide sufficient energy for operating the relay in view of the very low switching frequency preferably used. As previously described, amplifier A1 and its associated network elements produce a very low frequency square wave alternating current output which is used to drive the switching transistors Q1 and Q2. The alternate activation of these transistors alternately connects the negative and positive terminals, respectively, of signaling battery SB to the common bus connection of the detector apparatus. These transistors, through amplifiers A3 and A4, also control the energization of the synchronizing relays 1 and 2 which thus pick up alternately in a repeating cycle to synchronize the detector operation. It will be remembered that relays 1 and 2 pick up when the associated transistor Q1 or Q2 is not conducting. In other words, each relay picks up when its associated terminal of battery SB is not connected with apparatus common but rather is being monitored for a ground fault. The stepping pulses from amplifier/oscillator A1, through resistor R39 and amplifier A6, also alternately actuate transistors Q5 and Q6 which function as current pumps to supply reference currents against which ground fault leakage currents from battery SB may be compared. Transistor Q6 supplies a reference current, while transistor Q1 is activated, against which the ground fault leakage current from the positive terminal of battery SB is compared while transistor Q5 supplies a corresponding reference current for the negative terminal leakage current. These transistors are separately connected to the junction point of resistors R23, R24, and R25. The input to amplifier A6 checks that the ground rod connection GR1 is intact by comparing the voltage developed across resistor R24 and the associated voltage across the ground rod connections GR1, GR2, and resistor R25. In other words, the second ground rod GR2 is a redundancy check that the ground rod GR1 connection is still intact. The absence of either ground rod connection halts the operation of the current pumps Q5 and Q6, causing the detector apparatus to cease operation and indicate a possible ground fault. This is a vital check since the presence of the connection to ground rod GR1 is critical to operation of the apparatus, that is, to the detection of a ground fault on battery SB.

As long as there is no ground fault on either terminal of battery SB, the output of amplifier A5 alternates between positive and negative voltage levels in a square wave pattern. The negative voltage generator comprising capacitors C4 and C5 with contacts of relays 1 and 2 functions to hold the oscillator element active and therefore registry relay GND energized through the relay driver network. This retains the indication that no fault exists on the battery terminals. If the output of amplifier A5 remains steady at one polarity, relay GND becomes deenergized and releases to register a ground fault condition on battery SB. If ground faults exist on both terminals of the battery, the output of amplifier A5 is a square wave pattern but of reversed phase so that it does not synchronize with the operation of relays 1 and 2. Relay GND again becomes deenergized and releases to register the fault condition. If desired, as will be understood, other contacts of relay GND may be used to lock out the signaling system to inhibit unsafe operation of track switches or the display of improper indications on wayside signals.

The output of OP AMP A5 also may be used to control nonvital indicators such as the light emitting diodes (LED) D1 and D2 shown in the lower right of FIG. 1. These are driven through transistors Q3 and Q4 in an obvious manner. During operation when there is no, or at most a low level, leakage fault current, the two LEDs flash alternately at the frequency rate generated by amplifier A1. When the fault current is greater than the reference current value, the appropriate fault LED will illuminate steadily, indicating which terminal of the signal battery SB has a ground fault connection and thus a high leakage current. If both terminals of the battery should be simultaneously grounded, the LEDs will continue to alternately flash and the release of relay GND will indicate the double fault condition.

The arrangement described thus provides a desirable and vital detector for ground faults on the terminals of a direct current source, particularly for a signaling or communication system. The use of solid-state elements reduces the cost and the space requirements. By comparing the level of the fault leakage current from each terminal against reference currents of preselected levels, an effective and simple operation and arrangement is obtained. The fault detector apparatus of the invention is thus an efficient and economical arrangement for use in railway signaling and communication systems.

Although I have herein shown and described but a single specific arrangement of the ground fault detector apparatus embodying my invention, various modifications and changes within the scope of the appended claims may be made without departing from the spirit and scope of my invention.

Having now described the invention what I claim as new and desire to secure by Letters Patent, is:

1. Detector apparatus for registering ground faults on either terminal of a direct current energy source, comprising,
(a) a pair of switching means, each when active coupling a different terminal of said energy source to a common bus of said detector apparatus for producing a fault current signal having a level in accordance with the impedance of any ground fault on the opposite source terminal,
(b) a pulse generating means coupled for alternately activating said pair of switching means at a preselected rate,
(c) a current pump means controlled by said pulse generating means for alternately supplying a first and a second reference current signal, each having a preselected level and associated in time with a different one of said fault current signals alternately produced by said switching means, (d) a comparator means coupled for alternately receiving said first and second reference current signals, each jointly with the corresponding fault current signal, and responsive to each pair of received corresponding signals for generating a first or a second output signal in accordance with a predetermined comparison level of that pair to indicate the absence or presence, respectively, of a ground fault on the corresponding terminal of said energy source, (e) a register means normally occupying a first condition and operable to a second condition for registering a ground fault indication, and (f) a synchronizing means jointly controlled by said switching means and said pulse generating means and coupled for applying the output signals of said comparator means to hold said register means in its first condition only when said comparator output is a sequence of first signals in synchronism with the operation of said pulse generating means.

2. Detector apparatus as defined in claim 1 in which, (a) each switching means is a switching transistor coupled for connecting the associated source terminal to the apparatus common bus when activated by said pulse generator, and which further includes, (b) a ground rod driven to earth and coupled for completing a circuit path for each fault current signal from ground fault to said comparator means when the associated switching transistor is activated.

3. Detector apparatus as defined in claim 2 in which said current pump means comprises, (a) a first and a second transistor for supplying said first and second reference current signals, respectively, when alternately actuated, (b) an amplifier separately coupled for receiving pulses from said pulse generator means and responsive thereto for alternately actuating said first and second transistors, and (c) a second ground rod driven to earth and coupled to the first ground rod and to the input of said amplifier for inhibiting operation of said amplifier to actuate said first and second transistors if the earth connection of to either ground rod is interrupted.

4. Detector apparatus as defined in claim 2 or 3 in which said synchronizing means comprises, (a) a first and a second synchronizing relay, one coupled by each switching transistor to be controlled by said pulse generator for alternately opening and closing a contact as the associated transistor is activated and deactivated, respectively, and (b) a negative voltage generator network coupled for receiving said comparator output signals and controlled by said synchronizing relay contacts for producing output energy to hold said register means in its first condition only when said comparator output is a series of first signals in predetermined synchronization with the operation of said synchronizing relay contacts.

5. Detector apparatus as defined in claim 4 in which, (a) a first output signal from said comparator means has a positive characteristic when the positive terminal of said source is monitored for ground faults, (b) a first output signal from said comparator means has a negative characteristic when the negative terminal of said source is monitored for ground faults, whereby said sequence of first output signals from said comparator means is a square wave of alternate positive and negative pulses, and (c) said negative voltage generator network is responsive to hold said register means in its first condition only when the output from said comparator means is said square wave and is synchronized in a predetermined manner with the operation of said synchronizing relays.

6. Detector apparatus as defined in claim 5 in which said comparator means comprises, (a) an input resistor coupled between said first ground rod and the apparatus common bus for receiving said fault current signals produced by the alternate activation of said switching transistors, (b) said resistor further coupled for receiving the corresponding reference current signals supplied by the alternate actuation of said first and second transistors, (c) each corresponding pair of fault and reference current signals poled to flow in opposing directions through said input resistor for creating a comparison signal having a value in accordance with the relative levels of the corresponding fault and reference current signals, and (d) an amplifier element with its input coupled for receiving said comparison signal from said input resistor and responsive thereto for producing said first or second output signal as a particular reference current signal is greater than or less than the corresponding fault current signal, respectively.

* * * * *